United States Patent
Udagawa et al.

(10) Patent No.: US 7,379,715 B2
(45) Date of Patent: May 27, 2008

(54) TRANSMITTER APPARATUS AND METHOD USING POLAR MODULATION WITH SIGNAL TIMING ADJUSTMENT

(75) Inventors: Masaharu Udagawa, Setagaya-ku (JP); Mamoru Arayashiki, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 43 days.

(21) Appl. No.: 10/566,999

(22) PCT Filed: Jul. 21, 2004

(86) PCT No.: PCT/JP2004/010680

§ 371 (c)(1),
(2), (4) Date: Feb. 1, 2006

(87) PCT Pub. No.: WO2005/015756

PCT Pub. Date: Feb. 17, 2005

(65) Prior Publication Data

US 2006/0246856 A1     Nov. 2, 2006

(30) Foreign Application Priority Data

Aug. 7, 2003    (JP) ............................ 2003-288964

(51) Int. Cl.
*H01Q 11/12* (2006.01)

(52) U.S. Cl. ................ 455/126; 455/127.1; 455/114.2; 455/114.3; 455/125; 455/115.1; 375/296; 375/297; 330/149

(58) Field of Classification Search ............... 455/126, 455/127.1–127.5, 102, 108–113, 114.2, 114.3, 455/115.1, 125; 375/296, 297, 278, 285; 330/149; 332/3, 162

See application file for complete search history.

(56) References Cited

U.S. PATENT DOCUMENTS 6,043,707 A * 3/2000 Budnik ........................ 330/10

(Continued)

FOREIGN PATENT DOCUMENTS

JP           5-175743           7/1993

(Continued)

*Primary Examiner*—Edward F. Urban
*Assistant Examiner*—RuiMeng Hu
(74) *Attorney, Agent, or Firm*—Pearne & Gordon LLP

(57) ABSTRACT

A transmitting apparatus includes a polar signal producing circuit which produces signals corresponding to the amplitude and the phase of a transmitting modulated wave from an input signal and multiplies the amplitude signal by the phase signal by a multiplying circuit to amplitude modulate a phase-modulated wave to produce a transmitting modulated wave and radiates this transmitting modulated wave as radio wave from an antenna. An amplitude/phase detecting circuit detects an amplitude signal and a phase signal from the input of the multiplying circuit and the input of a phase-modulated signal producing circuit. A delay difference computing circuit computes a correlation function between the amplitude signal produced by the polar signal producing circuit and the amplitude signal detected by the amplitude/phase detecting circuit and a correlation function between the phase signal produced by the polar signal producing means and the phase signal detected by the amplitude/phase detecting means, and computes a delay difference between the amplitude signal and the phase signal from maximum values of the respective correlation functions. Then, a timing adjusting circuit adjusts the delay time between the amplitude signal and the phase signal on the base of the computed delay difference.

1 Claim, 15 Drawing Sheets

U.S. PATENT DOCUMENTS

| | | | |
|---|---|---|---|
| 6,246,286 B1 * | 6/2001 | Persson | 330/149 |
| RE37,407 E * | 10/2001 | Eisenberg et al. | 330/2 |
| 6,366,177 B1 * | 4/2002 | McCune et al. | 332/103 |
| 6,377,784 B2 | 4/2002 | McCune | |
| 6,449,465 B1 * | 9/2002 | Gailus et al. | 455/126 |
| 6,834,084 B2 * | 12/2004 | Hietala | 375/296 |
| 6,931,240 B2 * | 8/2005 | Hunton | 455/130 |
| 6,937,668 B2 * | 8/2005 | Sridharan et al. | 375/296 |
| 7,010,280 B1 * | 3/2006 | Wilson | 455/126 |
| 7,058,425 B1 * | 6/2006 | Takakusaki | 455/561 |
| 7,072,420 B2 * | 7/2006 | Persson | 375/297 |
| 7,072,626 B2 * | 7/2006 | Hadjichristos | 455/126 |
| 7,212,791 B2 * | 5/2007 | Arayashiki | 455/91 |
| 7,254,195 B2 * | 8/2007 | Servilio et al. | 375/345 |
| 2002/0079964 A1 * | 6/2002 | Miyatani | 330/149 |
| 2002/0193085 A1 * | 12/2002 | Mathe et al. | 455/126 |
| 2002/0196864 A1 * | 12/2002 | Booth et al. | 375/296 |
| 2003/0118143 A1 * | 6/2003 | Bellaouar et al. | 375/376 |
| 2003/0215026 A1 * | 11/2003 | Hietala | 375/297 |
| 2004/0219891 A1 * | 11/2004 | Hadjichristos | 455/102 |
| 2005/0001674 A1 * | 1/2005 | Saed et al. | 330/149 |
| 2005/0153670 A1 * | 7/2005 | Shi et al. | 455/126 |
| 2007/0053472 A1 * | 3/2007 | Feher | 375/347 |

FOREIGN PATENT DOCUMENTS

| | | |
|---|---|---|
| JP | 6-54877 | 7/1994 |
| JP | 7-264082 | 10/1995 |
| JP | 8-70331 | 3/1996 |
| JP | 9-298553 | 11/1997 |
| JP | 9-307525 | 11/1997 |
| JP | 2001-86094 | 3/2001 |
| JP | 2001-189685 | 7/2001 |
| JP | 2001-203772 | 7/2001 |
| JP | 2002-76785 | 3/2002 |
| JP | 2002-223124 | 8/2002 |
| JP | 2002-232325 | 8/2002 |
| JP | 2002-530992 | 9/2002 |
| JP | 2003-179514 | 6/2003 |

* cited by examiner

TRANSMITTER APPARATUS AND METHOD USING POLAR MODULATION WITH SIGNAL TIMING ADJUSTMENT

TECHNICAL FIELD

The present invention relates to a transmitting apparatus using a polar modulation applied to a radio communication apparatus.

BACKGROUND ART

FIG. 13 shows the first conventional example of a polar modulation transmitting apparatus. The polar modulation transmitting apparatus has a polar signal producing circuit 1201, an amplitude controlling circuit 1202, a phase-modulated signal producing circuit 1203, and a non-linear power amplifier 1204. In such a polar modulation transmitting apparatus, the polar signal producing circuit 1201 produces a signal corresponding to the amplitude and the phase of a transmitting modulated wave from an input signal, and the amplitude controlling circuit 1202 and the phase-modulated signal producing circuit 1203 produce an amplitude signal and a phase-modulated signal, respectively, based on this signal. While the non-linear power amplifier 1204 is operated in a non-linear saturation mode and has the phase modulated signal inputted thereto and amplitude modulates the phase modulated signal by changing a power source voltage according to the amplitude signal. In this manner, by operating the non-linear power amplifier 1204 in a non-linear saturation mode, current consumption can be reduced as compared to a case of using a linear power amplifier and hence the life span of a battery can be elongated in the transmitting apparatus driven by a battery (for example, see patent document 1).

FIG. 14 shows the second conventional example of a polar modulation transmitting apparatus. This polar modulation transmitting apparatus has a polar signal producing circuit 1301, a timing adjusting circuit 1302, an amplitude controlling circuit 1305, a phase-modulated signal producing circuit 1306, a power amplifier 1307, and in addition, an amplitude signal detecting circuit 1308, a phase signal detecting circuit 1309, and a PA calibration table 1310. By making a correction to the amplitude controlling circuit 1305 and the phase-modulated signal producing circuit 1306 by the use of this calibration table 1310, amplitude-amplitude distortion (AM-AM distortion) and amplitude-phase distortion (AM-PM distortion) of the power amplifier 1307 can be corrected. Moreover, by adjusting the timings of an amplitude signal and a phase signal by the timing adjusting circuit 1302, it is possible to correct a delay difference between paths of the amplitude signal and the phase signal and to prevent the deterioration of transmission quality caused by the delay difference (for example, see patent document 2). For example, according to W-CDMA standards, transmission quality is expressed by ACLR (Adjacent Channel Leakage power Ratio) and EVM (Error Vector Magnitude).

FIG. 15 shows the third conventional example of a polar modulation transmitting apparatus. In this polar modulation transmitting apparatus, delay circuits 1412, 1413 are added to the modulation section 1410. The timings of a drain voltage (amplitude) and a modulated wave signal (phase) are adjusted by the use of these delay circuits 1412, 1413 to correct a delay difference in path between the amplitude signal and the phase signal. With this, it is possible to prevent the deterioration of ACLR and EVM caused by the delay difference between the amplitude signal and the phase signal (for example, see patent document 3).

FIG. 16 shows the fourth conventional example of a polar modulation transmitting apparatus. This polar modulation transmitting apparatus has phase detecting means 1502, 1503 for detecting the phase of an RF output signal, amplitude detection means 1501 for detecting the envelope of the amplitude of the RF output signal, synchronization detecting means 1512 for detecting the synchronization between the phase and the amplitude of the RF output signal, and synchronization controlling means 1513 for controlling delay means 1515 on the basis of the detected synchronization. The timings of the amplitude signal and the phase signal are adjusted by the use of these means to correct the delay difference in path between the amplitude signal and the phase signal. With this, it is possible to prevent the deterioration of ACLR and EVM caused by the delay difference between the amplitude signal and the phase signal (for example, see patent document 4).

However, the first conventional example shown in FIG. 13 does not have timing adjusting means and hence can not correct the delay difference in path between the amplitude signal and the phase signal and hence can not prevent the deterioration of transmission quality caused by the delay difference.

Further, the polar modulation transmitting apparatuses of the second conventional example shown in FIG. 14 and the third conventional example shown in FIG. 15 do not have a synchronization circuit for synchronizing the amplitude signal and the phase signal automatically and hence do not have a method except for adjusting synchronization manually. Moreover, it is difficult for a common user to adjust synchronization when the user uses a product after the product is shipped.

Still further, the polar modulation transmitting apparatuses of the fourth conventional example shown in FIG. 16 is configured to detect an amplitude envelope and a phase from the RF output signal of a multiplier or a power amplifier. However, to detect the synchronization between the amplitude signal and the phase signal by such a configuration, a signal in an RF band needs to be demodulated into a base band by some means, which results in using a circuit having a delay that is too large to neglect such as low pass filter. As a result, this may vary delay at the time of detection and reduce the accuracy of detection of delay.

[Patent document 1] Specification of U.S. Pat. No. 6,377,784B2
[Patent document 2] Specification of U.S. Pat. No. 6,366,177B1
[Patent document 3] Japanese Examined Patent Publication No. 6-54877 (FIG. 6)
[Patent document 4] Japanese Patent Publication No. 2002-530992 (FIG. 2)

DISCLOSURE OF THE INVENTION

The present invention has been made in view of the above circumstances. The object of the invention is to provide a transmitting apparatus capable of automatically adjusting the synchronization of an amplitude signal and a phase signal in a transmitting apparatus using polar modulation.

A transmitting apparatus of the invention is a transmitting apparatus using polar modulation and includes: polar signal producing means for producing signals corresponding to an amplitude and a phase of a transmitting modulated signal from an input signal; amplitude signal producing means for producing an amplitude signal from a signal corresponding to the amplitude; phase-modulated signal producing means for producing a phase-modulated signal from a signal corresponding to the phase; amplitude modulation amplifying means for amplitude modulating the phase-modulated signal by the amplitude signal and the phase-modulated signal to produce a transmitting modulated signal; amplitude/phase detecting means for detecting an amplitude signal and a phase signal from an input signal to the amplitude modulation amplifying means and an input signal to the phase-modulated signal producing means; delay difference computing means for computing a delay difference between an amplitude signal and a phase signal based on the signal corresponding to the amplitude and the signal corresponding to the phase, which are produced by the polar signal producing means, and the amplitude signal and the phase signal, which are detected by the amplitude/phase detecting means; and timing adjusting means for adjusting timings of the amplitude signal and the phase signal based on the delay difference computed by the delay difference computing means.

With the above-described constitution, a delay difference is computed by the delay difference computing means based on the signal corresponding to the amplitude and the signal corresponding to the phase, which are produced by the polar signal producing means, and the amplitude signal and the phase signal, which are detected by the amplitude/phase detecting means and the timings of the amplitude signal and the phase signal are adjusted by the timing adjusting means based on the obtained delay difference. With this, it is possible to adjust the delay difference between the amplitude signal and the phase signal and hence to automatically adjust the synchronization of the amplitude signal and the phase signal. Further, the amplitude/phase detecting means detects the amplitude signal and the phase signal, for example, just before the amplitude modulation amplifying means. With this, it is possible to make the delay difference of the amplitude signal and the phase signal between the detection position and the amplitude modulation amplifying means smaller than a delay difference required from the transmitting characteristics of ACLR and EVM. Further, as described above in the case of detecting the amplitude signal and the phase signal just before the amplitude modulation amplifying means, the amplitude signal and the phase signal are detected from a signal in a base band, so that it is possible to eliminate a circuit having a large delay such as low pass filter from the amplitude/phase detecting means. As a result, it is possible to improve the detection accuracy of the delay difference and the accuracy of adjustment of synchronization.

Further, as one aspect of the invention, it also includes the above-described transmitting apparatus such that the delay difference computing means computes a correlation function between the signal corresponding to the amplitude produced by the polar signal producing means and the amplitude signal detected by the amplitude/phase detecting means and a correlation function between the signal corresponding to the phase produced by the polar signal producing means and the phase signal detected by the amplitude/phase detecting means, and computes the quantity of delay of the amplitude signal and the quantity of delay of the phase signal from maximum values of the respective correlation functions related to these amplitude and phase and computes a delay difference from a difference between the quantity of delay of the amplitude signal and the quantity of delay of the phase signal.

With the above-described construction, the quantity of delay of the amplitude signal and the quantity of delay of the phase signal can be computed by the maximum values of the correlation functions in the amplitude signal and the phase signal, respectively, and the delay difference can be computed from the difference between the quantity of delay of the amplitude signal and the quantity of delay of the phase signal. With this, it is possible to adjust timings of the amplitude signal and the phase signal.

Still further, as one aspect of the invention, it also includes the above-described transmitting apparatus such that the amplitude/phase detecting means is constructed of a digital circuit and has selecting means for selecting either the amplitude signal or the phase signal and analog-digital converting means for converting the selected amplitude signal or phase signal provided at an input section of the amplitude signal and the phase signal.

With the above-described construction, the analog-digital converting means can be commonly used for detecting the amplitude signal and for detecting the phase signal. Hence, it is possible to reduce the size and the number of parts of a circuit relating to the detection of the amplitude signal and the phase signal.

Still further, as one aspect of the invention, it also includes the above-described transmitting apparatus such that the timing adjusting means has delay means for delaying at least one of the amplitude signal and the phase signal and delay controlling means for controlling the quantity of delay of the delay means.

With the above-described construction, at least one of the quantity of delay of the amplitude signal and the quantity of delay of the phase signal can be finely adjusted by the delay control means. Hence, it is possible to improve the accuracy of adjustment of synchronization.

Still further, as one aspect of the invention, it also includes the above-described transmitting apparatus such that the timing adjusting means has rough adjustment means for roughly adjusting the quantity of delay of the amplitude signal and the quantity of delay of the phase signal and fine adjustment means for finely adjusting the quantity of delay.

With the above-described construction, the quantity of delay of the amplitude signal and the quantity of delay of the phase signal can be finely adjusted by the rough adjustment means and the fine adjustment means. Hence, it is possible to improve the accuracy of synchronization adjustment.

Still further, as one aspect of the invention, it also includes the above-described transmitting apparatus such that the timing adjusting means is constructed of a digital circuit and varies a clock frequency of this digital circuit to adjust the quantity of delay of the amplitude signal and the quantity of delay of the phase signal.

With the above-described construction, the quantity of delay of the amplitude signal and the quantity of delay of the phase signal can be finely adjusted by changing the clock frequency of the digital circuit. Hence, it is possible to improve the accuracy of synchronization adjustment.

Still further, as one aspect of the invention, it also includes the above-described transmitting apparatus described above such that the timing adjusting means has a plurality of inverters connected in cascade as the delay means and a selector for switching outputs of the inverters.

With the above-described construction, it is possible to adjust the quantity of delay of the amplitude signal and the quantity of delay of the phase signal by a simple construction by switching the plurality of inverters connected in cascade.

Still further, as one aspect of the invention is also included the above-described transmitting apparatus such that the timing adjusting means has a digital filter capable of varying a delay time according to a control signal as the delay means.

With the above-described construction, it is possible to adjust the quantity of delay of the amplitude signal and the quantity of delay of the phase signal by providing the digital filter and varying the delay time by the control signal.

Still further, as one aspect of the invention, it also includes the above-described transmitting apparatus such that the amplitude modulation amplifying means is configured to have a power amplifier.

Still further, as one aspect of the invention, it also includes the above-described transmitting apparatus such that the amplitude modulation amplifying means is configured to have a variable gain amplifier.

Still further, as one aspect of the invention, it also includes the above-described transmitting apparatus such that the amplitude modulation amplifying means is configured to have a mixing circuit.

With the above-described constructions, it is possible to amplitude modulate the phase-modulated signal to produce a transmitting modulated signal by performing multiplication or the like by the use of any one of the amplitude modulation amplifying means.

A synchronization adjusting method of the invention is a method that synchronizes an amplitude signal and a phase signal in a transmitting apparatus using polar modulation and includes the steps of: producing signals corresponding to an amplitude and a phase of a transmitting modulated signal from an input signal; producing an amplitude signal from a signal corresponding to the amplitude; producing a phase-modulated signal from a signal corresponding to the phase; multiplying the amplitude signal by the phase-modulated signal to amplitude modulate the phase-modulated signal to produce a transmitting modulated signal; detecting an amplitude signal and a phase signal from an amplitude signal before the amplitude signal being multiplied by the phase-modulated signal and a signal corresponding to a phase before the phase-modulated signal being produced; computing a delay difference between an amplitude signal and a phase signal based on the signal corresponding to the amplitude and the signal corresponding to the phase, which are produced from the input signal, and the amplitude signal and the phase signal, which are detected; and adjusting timings of the amplitude signal and the phase signal based on the computed delay difference to synchronize the amplitude signal and the phase signal.

With the above-described steps, it is possible to adjust the delay difference between the amplitude signal and the phase signal and to automatically adjust the synchronization of the amplitude signal and the phase signal.

According to the invention, it is possible to provide a transmitting apparatus capable of automatically adjusting the synchronization of the amplitude signal and the phase signal in a transmitting apparatus using polar modulation.

BRIEF DESCRIPTION OF THE DRAWINGS

FIG. 2 shows an example of degradation in the transmission characteristics caused by a delay difference between an amplitude signal and a phase signal and FIG. 2A is a graph showing ACLR characteristic of WCDMA modulation at 5 MHz of separation and FIG. 2B is a graph showing ACLR characteristic of WCDMA modulation at 10 MHz.

FIG. 7 is graphs showing an example of an input signal wave in the delay difference computing circuit of this embodiment and FIG. 7A is a graph showing an example of an amplitude signal and FIG. 7B is a graph showing an example of a phase signal.

FIG. 8 is graphs showing an example of a correlation function computed by the delay difference computing circuit of this embodiment and FIG. 8A is a graph showing an example of a correlation function of an amplitude and FIG. 8B is a graph showing an example of a correlation function of a phase signal.

Figure 1:
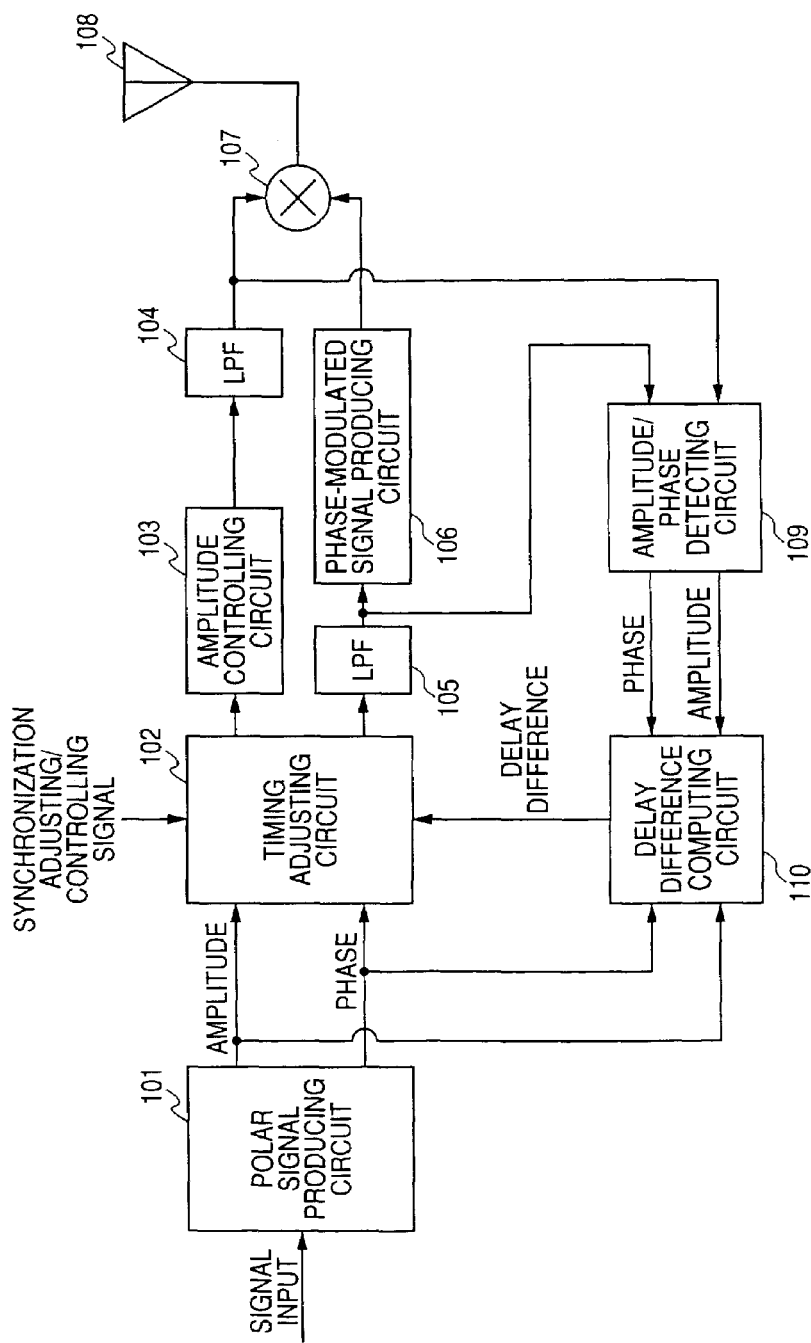
FIG. 1 is a block diagram showing the construction of a polar modulation transmitting apparatus in accordance with the present invention.

Here, in the drawings, a reference numeral 101 denotes a polar signal producing circuit, 102 denotes a timing adjusting circuit, 103 denotes an amplitude controlling circuit, 104 and 105 denote low pass filters, 106 denotes a phase-modulated signal producing circuit, 107 denotes a multiplying circuit, 109 denotes an amplitude/phase detecting circuit, 110 denotes a delay difference computing circuit, 311, 312 and 412 denote A/D converters, 313 and 314 denote D/A converters, 411 denotes a selector switch, 801 and 802 denote variable delay circuits, and 803 denotes a control circuit.

BEST MODE FOR CARRYING OUT THE INVENTION

In this embodiment, one example of a polar modulation transmitting apparatus corresponding to a transmitting apparatus using polar modulation, and a synchronization circuit and a synchronization adjusting method of an amplitude signal and a phase signal in this polar modulation transmitting apparatus will be described.

FIG. 1 is a block diagram showing the construction of a polar modulation transmitting apparatus in accordance with an embodiment of the present invention. The polar modulation transmitting apparatus of this embodiment is constructed of a polar signal producing circuit 101, a timing adjusting circuit 102, an amplitude controlling circuit 103, low pass filters 104 and 105, a phase-modulated signal producing circuit 106, a multiplying circuit 107, a transmitting antenna 108, an amplitude/phase detecting circuit 109, and a delay difference computing circuit 110.

In the polar modulation transmitting apparatus constructed in this manner, the polar signal producing circuit 101 corresponds to one example of polar signal producing means and produces a signal corresponding to the amplitude and the phase of a transmitting modulated wave from an inputted signal. The amplitude controlling circuit 103 corresponds to one example of amplitude signal producing means and adjusts the level of a signal corresponding to amplitude to produce an amplitude signal. Further, the phase-modulated signal producing circuit 106 corresponds to one example of phase-modulated signal producing means and is constructed of a power VCO, for example, and produces a phase modulated wave (phase modulated signal) from a signal corresponding to a phase. Still further, the multiplying circuit 107 corresponds to one example of amplitude modulation amplifying means and multiplies an amplitude signal by a phase modulated wave to amplitude-modulate the phase modulated wave to produce a transmitting modulated wave (transmitting modulated signal). This transmitting modulated wave is radiated as radio wave from the antenna 108.

The multiplying circuit 107 has a function of amplitude modulation amplifying means of amplitude-modulating a phase-modulated wave to produce a transmitting modulated wave and is constructed of, for example, a power amplifier operated in a saturation mode. Further, even if a variable gain amplifier or a mixer circuit is used as the multiplying circuit 107, the same function can be obtained.

In this regard, the low pass filters 104, 105 included in the polar modulation transmitting apparatus are not essential constituent elements in this embodiment but are added so as to describe the occurrence of delay in the signals of an amplitude signal corresponding to amplitude and a phase signal by the phase modulated wave and the synchronization of them. As for the positions of the low pass filters 104, 105, they are connected to, for example, the output of a D/A converter for the purpose of cutting out harmonics.

In general, a signal delay occurs in a low pass filter. For example, in the case where a cut-off frequency is fc in a first-order low pass filter, a delay of $1/2\pi \times fc$ occurs in a low frequency range. Moreover, even if a delay, caused not only by the first-order low pass filter but also by higher-order low pass filters, and other signal delay occur, operations are not changed.

Figure 2A:
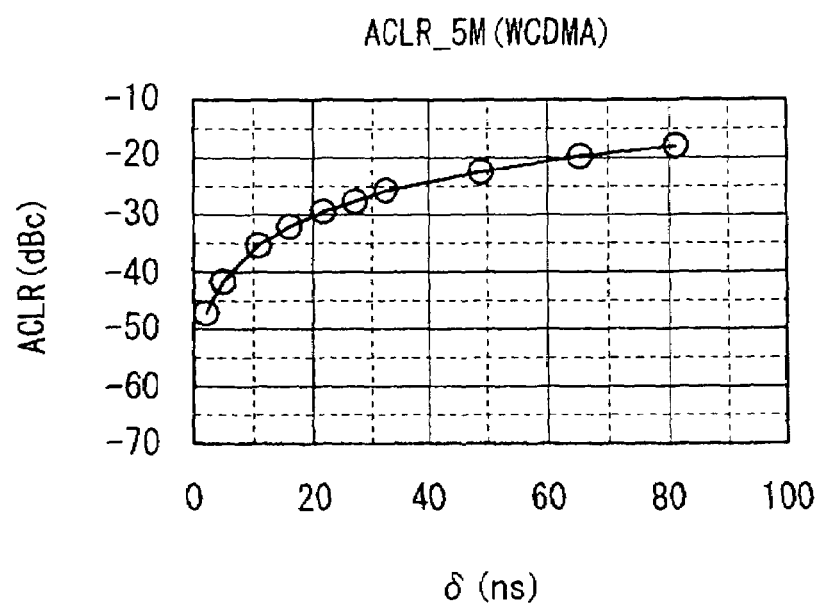
Figure 2B:
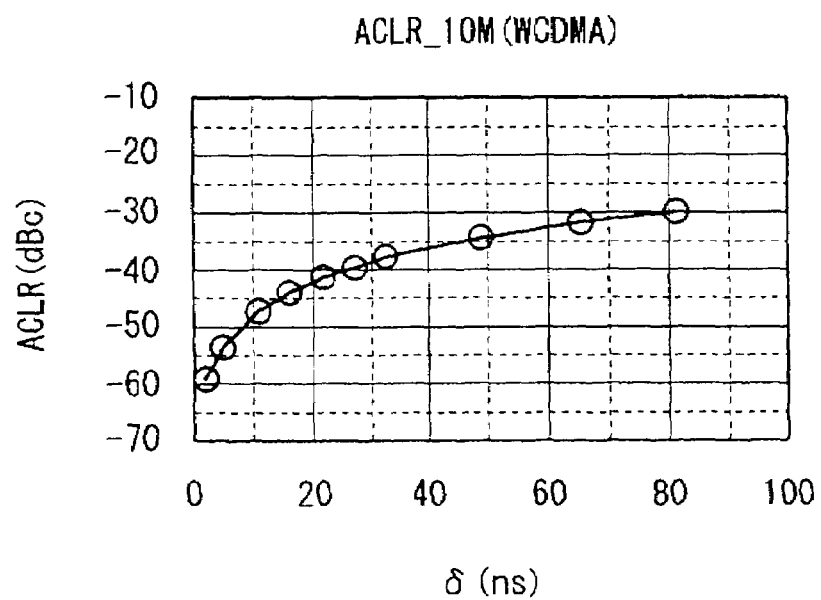
Figure 3:
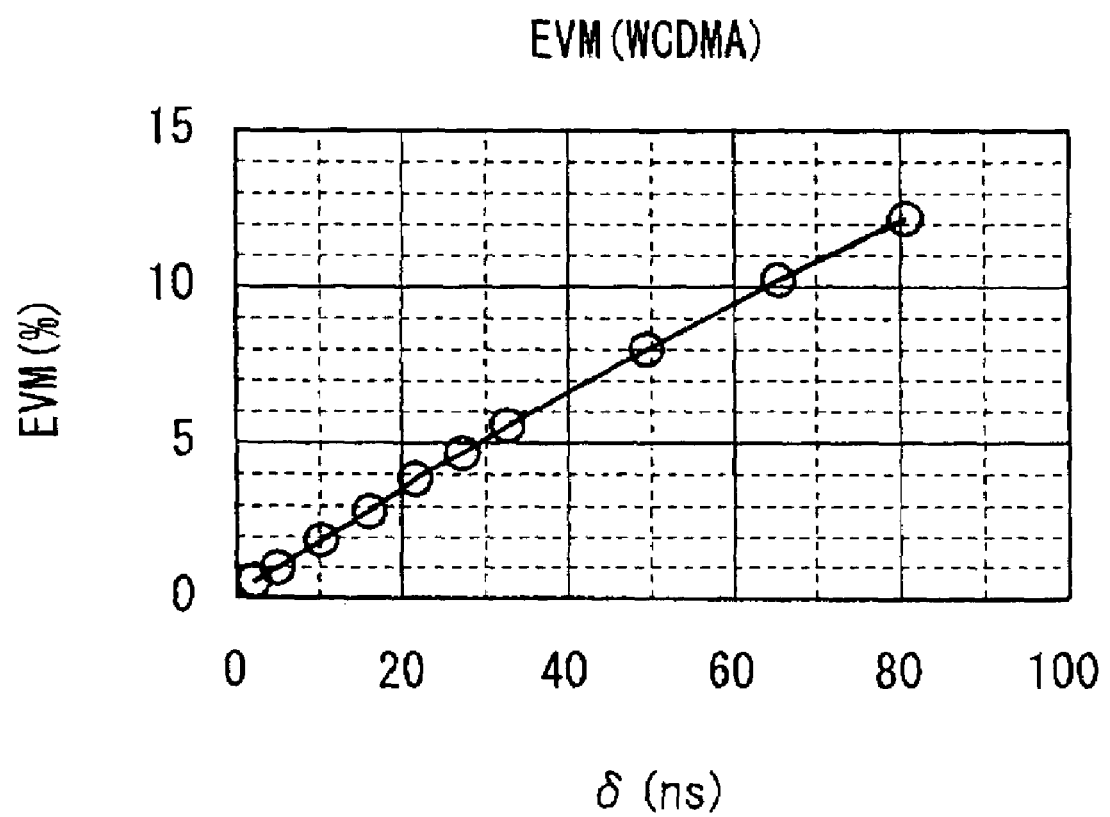
FIG. 3 shows an example of degradation in the transmission characteristics caused by a delay difference between an amplitude signal and a phase signal and is a graph showing EVM characteristics of WCDMA modulation.

When such a delay in signal occurs in the path of an amplitude signal and in the path of a phase signal and there is a delay difference δ between the signals, the characteristics of ACLR and EVM in the polar modulation transmitting apparatus are degraded. FIGS. 2 and 3 show examples of the degradation of transmission characteristics caused by the delay difference δ. FIGS. 2A and 2B show ACLR characteristics of WCDMA at 5 MHz separation and 10 MHz separation and FIG. 3 shows EVM characteristics, respectively.

The amplitude/phase detecting circuit 109 and the delay difference computing circuit 110 are provided so as to prevent the degradation of characteristics caused by delay in the amplitude signal and the phase signal. The amplitude/phase detecting circuit 109 corresponds to one example of amplitude/phase detecting means and detects the amplitude signal and the phase signal from the input of the multiplying circuit 107 and the input of the phase-modulated signal producing circuit 106. Further, the delay difference computing circuit 110 corresponds to one example of delay difference computing means and computes the delay difference between the amplitude signal and the phase signal on the basis of the amplitude signal and the phase signal detected by the amplitude/phase detecting circuit 109. The timing adjusting circuit 102 corresponds to one example of timing adjusting means and performs timing adjustment based on the delay difference to synchronize the amplitude signal and the phase signal automatically.

In this manner, the amplitude signal, which is amplitude modulated by the multiplying circuit 107, and the phase signal are synchronized to reduce the delay difference δ sufficiently, whereby a polar modulation transmitting apparatus having excellent characteristics of ACLR and EVM can be realized.

In this regard, it is preferable that the amplitude/phase detecting circuit 109 detects the amplitude signal and the phase signal (phase modulated wave) just before the multiplying circuit 107, as shown in FIG. 1. With this, the delay differences in the amplitude signal and the phase signal between the detection position of the signals and the multiplying circuit 107 can be smaller than a value required from the characteristics of ACLR and EVM. Further, because the signals can be detected from signals in a base band, a circuit having a large delay such as a low pass filter can be eliminated from the amplitude/phase detecting circuit 109. As result, the accuracy of detection of the delay difference can be improved more than ever before.

Figure 4:
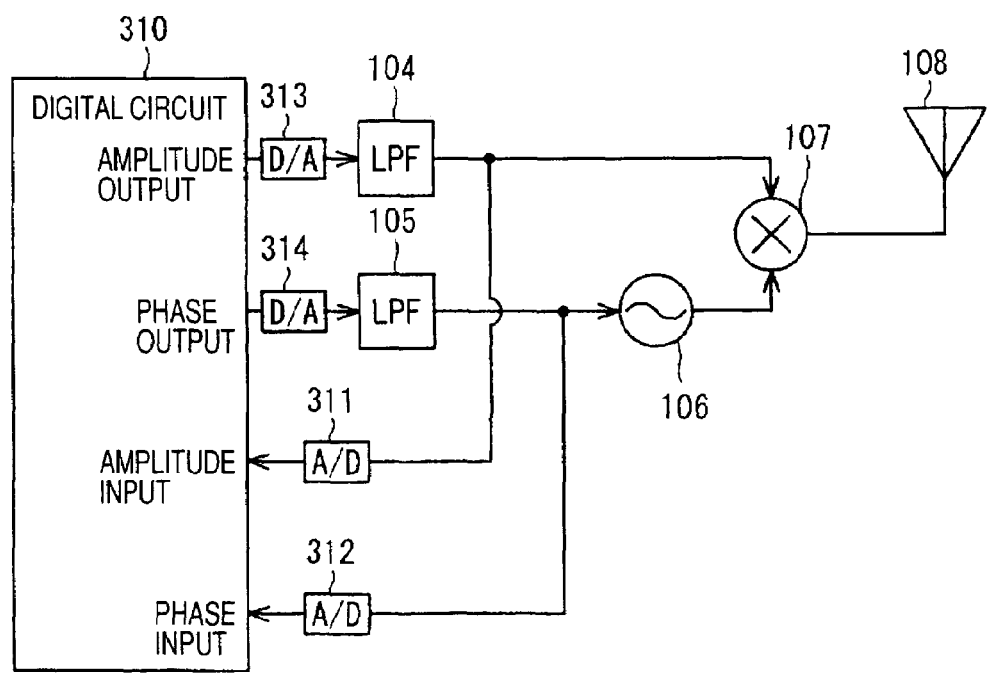
FIG. 4 is a block diagram showing an example of specific construction of a main portion including an amplitude/phase detecting circuit in a polar modulation transmitting apparatus of this embodiment.
Figure 5:
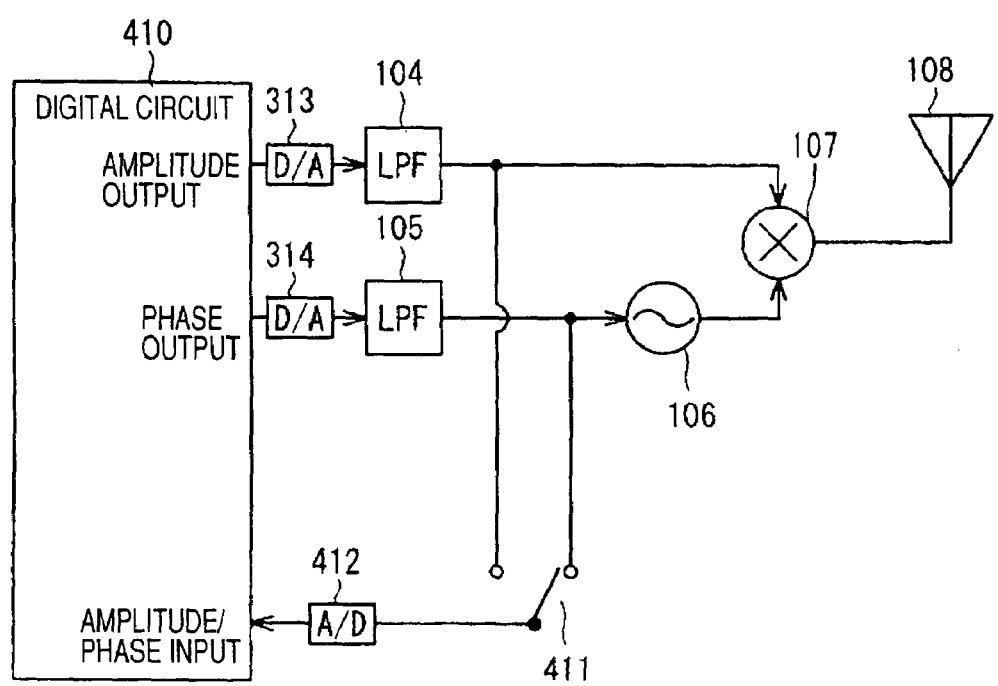
FIG. 5 is a block diagram showing another example of specific construction of a main portion including an amplitude/phase detecting circuit in a polar modulation transmitting apparatus of this embodiment.

Next, the functions and operations of the amplitude/phase detecting circuit 109, the delay difference computing circuit 110, and the timing adjusting circuit 102 constructing the polar modulation transmitting apparatus will be described in detail. FIGS. 4 and 5 show specific construction example of the main portion of the polar modulation transmitting apparatus. Each of digital circuit 310 in FIG. 4 and digital circuit 410 in FIG. 5 has functions of the amplitude/phase detecting circuit 109, the delay difference computing circuit 110, and the timing adjusting circuit 102.

First, the amplitude/phase detecting circuit 109 will be described. The amplitude/phase detecting circuit 109 detects a phase signal and an amplitude signal which is to be amplitude modulated by the multiplying circuit 107. At this time, the amplitude/phase detecting circuit 109 detects the amplitude signal from the output of the low pass filter 104 and detects the phase signal from the input of the phase-modulated signal producing circuit 106 made of a power VCO. Here, the power VCO is used as the phase-modulated signal producing circuit 106 but it is not intended to limit the phase-modulated signal producing circuit 106 to the power VCO.

In the first example shown in FIG. 4, A/D converters 311, 312 and D/A converters 313, 314 are connected to the digital circuit 310. In this case, the amplitude signal outputted from the low pass filter 104 is converted to a digital signal by the A/D converter 311 and is inputted, and the phase signal outputted from the low pass filter 105 and inputted to the phase-modulated signal producing circuit 106 is converted to a digital signal by the A/D converter 312 and is inputted. Further, the amplitude signal outputted from the digital circuit 310 is converted to an analog signal by the D/A converter 313 and is inputted to the low pass filter 104, and the phase signal outputted from the digital circuit 310 is converted to an analog signal by the D/A converter 314 and is inputted to the low pass filter 105.

In the construction shown in FIG. 4, both of the amplitude signal and the phase signal before the detection position of the amplitude/phase detecting circuit 109, that is, a phase-modulated signal producing section by the phase-modulated signal producing circuit 106 and before an amplitude modulating section by the multiplying circuit 107 are signals in the base band. Hence, these signals can be processed as follows: these signals can be directly inputted to the AD converters 311, 312 without being demodulated and without using a log amplifier, thereby being converted to digital signals, and then the digital signals are inputted to the digital circuit 310, thereby being processed. In this manner, by detecting the amplitude signal and the phase signal from the output of the low pass filters 104, 105, the delay difference between both signals in a signal path to the multiplying circuit 107 can be reduced.

In the second example shown in FIG. 5, the A/D converter 412 and the D/A converters 313, 314 are connected to the digital circuit 410 and a selector switch 411 is provided in the input line of the A/D converter 412. In this case, the amplitude signal outputted from the low pass filter 104 or the phase signal outputted from the low pass filter 105 and inputted to the phase-modulated signal producing circuit 106 is selected by a selector switch 411 and is converted to a digital signal by the A/D converter 412 and the digital signal is inputted to the digital circuit 410. The example shown in FIG. 4 is configured to use the separate A/D converters for the amplitude signal and for the phase signal, whereas the example shown in FIG. 5 is configured to switch one common A/D converter for use between the amplitude signal and the phase signal and can realize the same function. In this case, the amplitude signal and the phase signal are switched by the selector switch 411 and are alternately converted to the digital signal by the A/D converter 412 and are inputted to the digital circuit 410 where they are processed. With this, the parts can be reduced in number and hence cost can be reduced.

In this regard, it is also possible to employ a construction in which the delay difference computing circuit 110 is realized by an analog circuit and that the amplitude/phase detecting circuit 109 is constructed of an analog circuit without providing an A/D converter.

Next, the delay difference computing circuit 110 will be described. The delay difference computing circuit 110 is constructed of, for example, a digital circuit and has such a function that computes a correlation function before the delay between the amplitude signal and the phase signal and a correlation function after the delay between the amplitude signal and the phase signal, respectively, and detects maximum values of them. Here, the delay difference computing circuit 110 can be constructed of an analog circuit.

Figure 6:
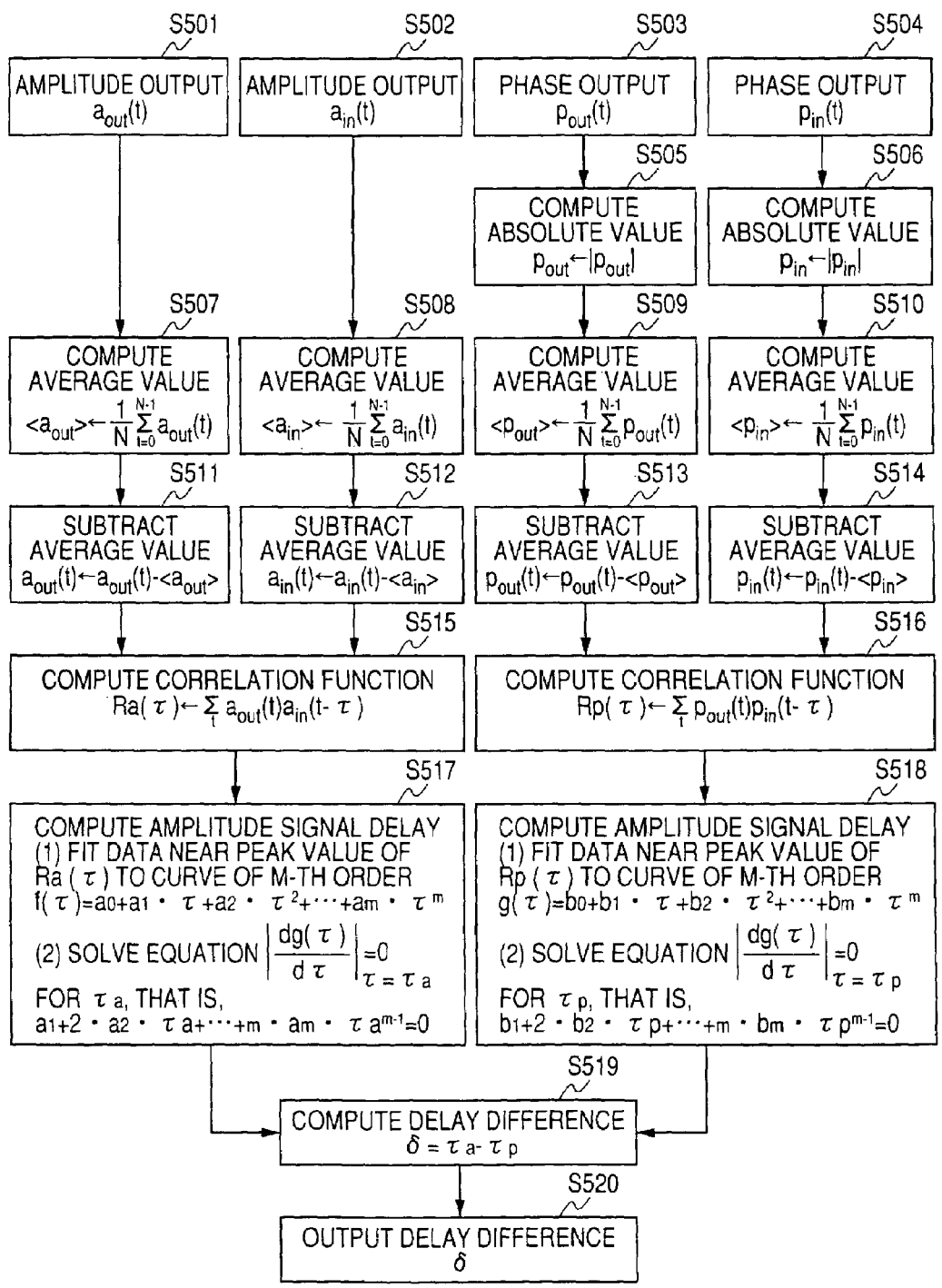
FIG. 6 is a flow chart showing a procedure of computing a delay difference in a delay difference computing circuit of this embodiment.
Figure 7A:
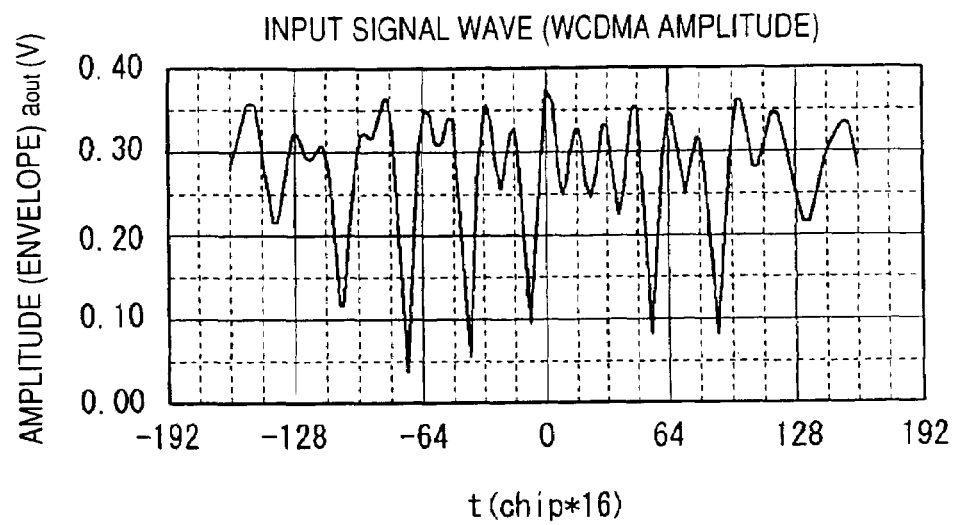
Figure 7B:
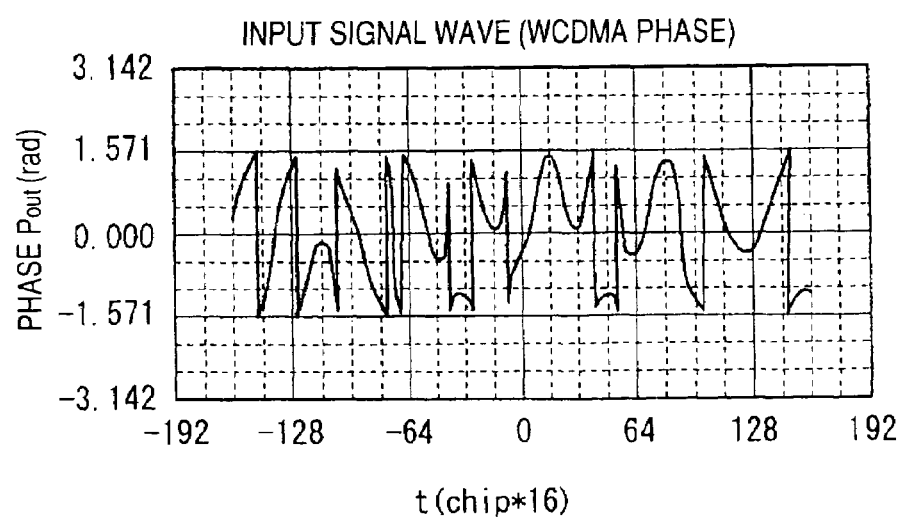

FIG. 6 is a flow chart showing a delay difference computing procedure in the delay difference computing circuit 110 and FIGS. 7A and 7B show examples of input signal waves. Here, it is assumed that the input signal waves are time waves $a_{out}(t)$, $p_{out}(t)$ of the amplitude signal and the phase signal produced by the polar signal producing circuit 101 and shown in FIGS. 7A and 7B, and are time waves $a_{in}(t)$, $p_{in}(t)$ of the amplitude signal and the phase signal including delay detected by the amplitude/phase detecting circuit 109 (steps S501 to S504). In this embodiment is shown an example using a WCDMA modulated wave as the signal wave. The absolute values of the time-waveforms $a_{in}(t)$ and $p_{in}(t)$ of the amplitude signal and the phase signal are calculated (steps S505, S506) and then the average values of their time-waveforms $a_{in}(t)$, $p_{in}(t)$, $a_{out}(t)$, and $p_{out}(t)$, respectively are obtained (steps S507 to S510) and then their original time-waveforms are replaced by the values obtained by subtracting the average values from their original time-waveforms (steps S511 to S514).

Next, the correlation function $Ra(\tau)$ of the time-waveforms $a_{out}(t)$ and $a_{in}(t)$ and the correlation function $Rp(\tau)$ of the time-waveforms $p_{out}(t)$ and $p_{in}(t)$ are calculated according to the following equations (steps S515, S516).

$$Ra(\tau)=\Sigma a_{out}(t) \times a_{in}(t-\tau) \tag{1}$$

$$Rp(\tau)=\Sigma p_{out}(t) \times p_{in}(t-\tau) \tag{2}$$

Figure 8A:
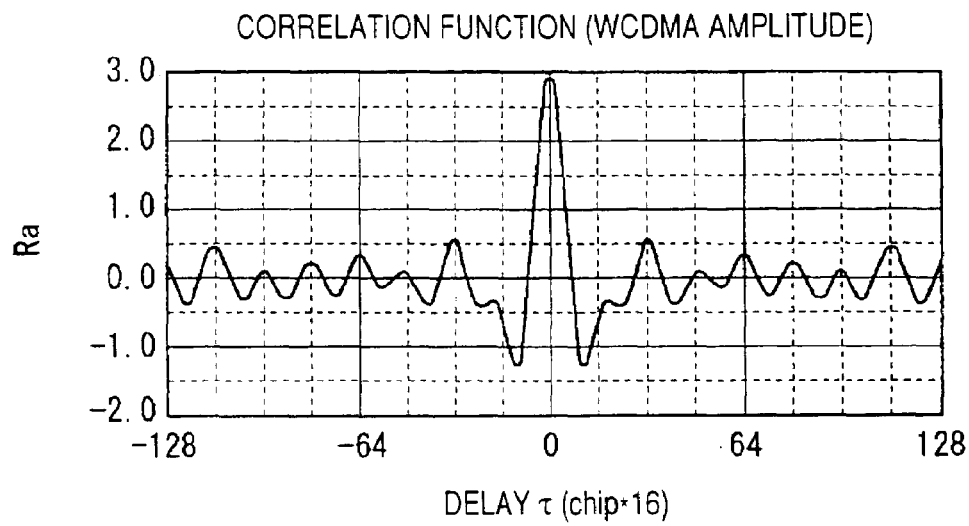
Figure 8B:
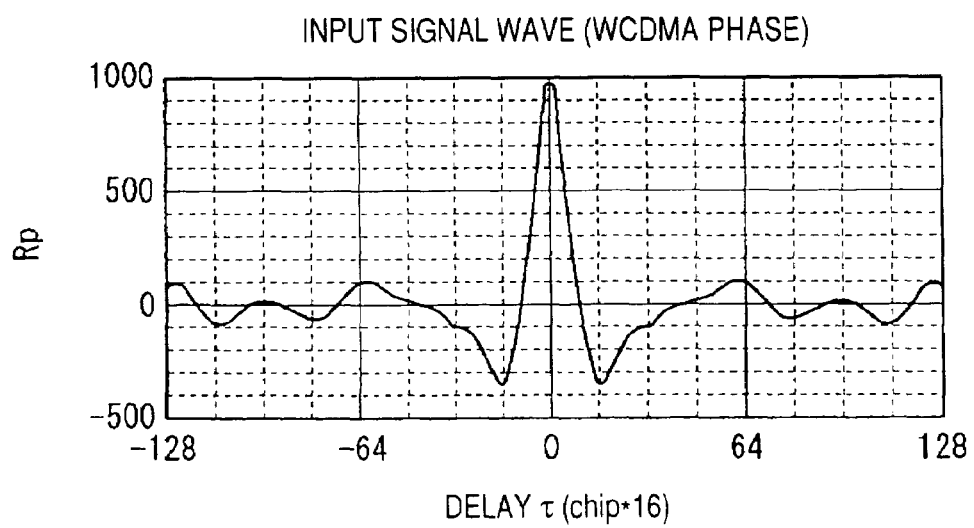

At steps S517, S518, maximum values $\tau_a$ and $\tau_p$ are obtained respectively from the computed correlation functions Ra and Rp. FIGS. 8A and 8B show curves showing the correlation functions Ra and Rp computed by the above equations, and both correlation functions have no delay and have maximum at $\tau=0$. In this manner, $\tau$s at which the correlation functions Ra and Rp have maximum are the delay of the amplitude and the delay of the phase signal, respectively, and the difference between them is the delay difference between the amplitude signal and the phase signal (steps S519 and S520).

Here, while the examples using the WCDMA modulated waves have been described as shown in FIGS. 7 and 8, the same holds true for modulated waves of the other type and for special waves for synchronizing the amplitude signal and the phase signal.

Figure 9:
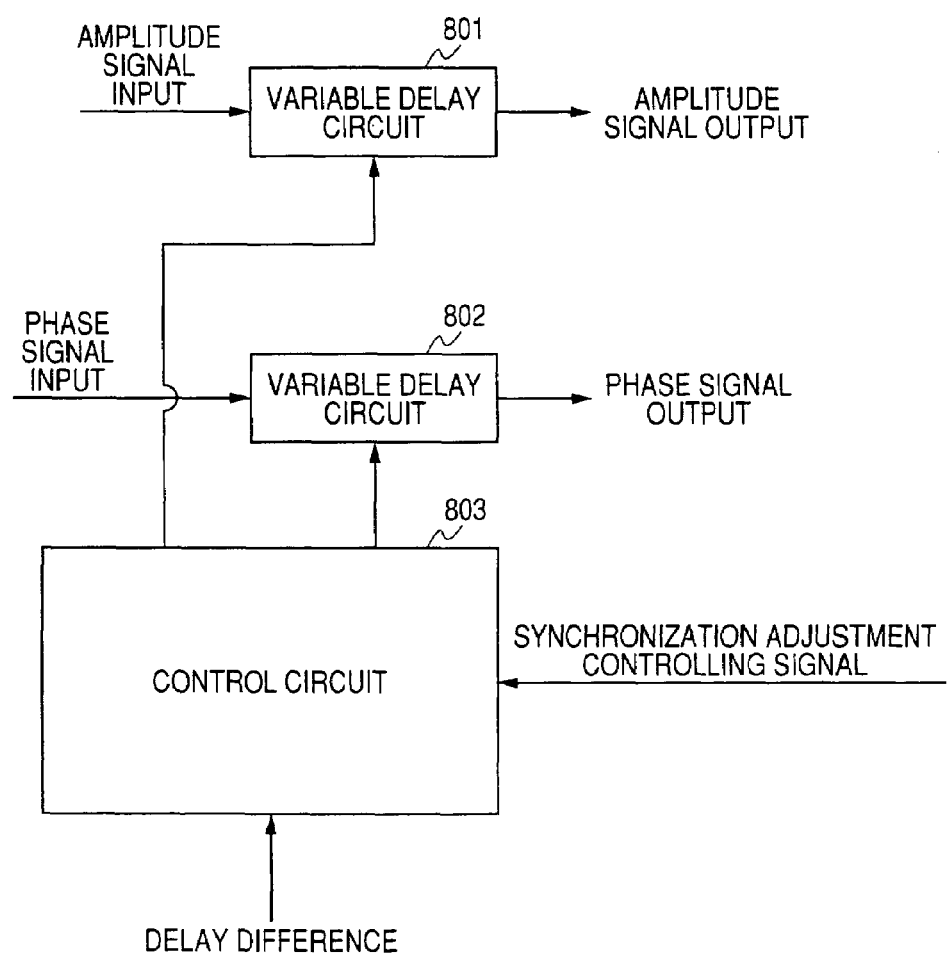
FIG. 9 is a block diagram showing an example of construction of a timing adjusting circuit of this embodiment.

Next, the timing adjusting circuit 102 will be described. FIG. 9 shows the construction example of a timing adjusting circuit. The timing adjusting circuit 102 is configured to include the first and second variable delay circuits 801, 802 capable of varying a delay time and a control circuit 803 for controlling the delay time of the variable delay circuits 801, 802.

When the control circuit 803 has a synchronization adjustment controlling signal inputted, the control circuit 803 outputs a delay control signal for controlling the delay time of the first variable delay circuit 801 and a delay control signal for controlling the delay time of the second variable delay circuit 802 with reference to the newly computed delay difference, respectively.

The amplitude signal is inputted to the first variable delay circuit 801 and an amplitude signal delayed according to the delay control signal is outputted. At the same time, the phase signal is inputted to the second variable delay circuit 802 and a delayed phase signal is outputted. In this regard, while both of the amplitude signal and the phase signal are delayed in this construction, a construction may be employed in which only one of the amplitude signal and the phase signal is delayed and this construction can realize the same function.

Figure 10:
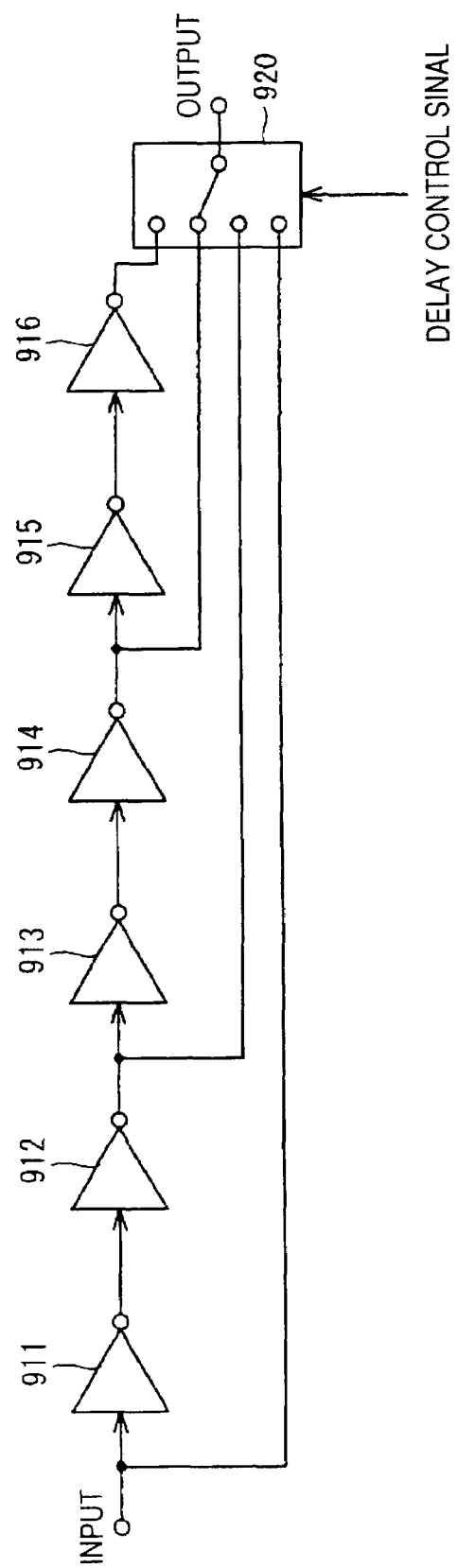
FIG. 10 is a block diagram showing the first example of a variable delay circuit in the timing adjusting circuit of this embodiment.

Here, a specific construction example of the variable delay circuit using the first and second variable delay circuits 801, 802 will be described. FIG. 10 shows the first example of the variable delay circuit. This variable delay circuit of the first example is configured to include inverters (inverting circuits) 911 to 916 connected in cascade and a selector 920 for selecting the outputs of these inverters 911 to 916. In this configuration, by switching the selector 920 by a delay control signal of a control signal to change the number of inverters included in the signal path, the delay time can be controlled by the delay time of the inverter.

Figure 11:
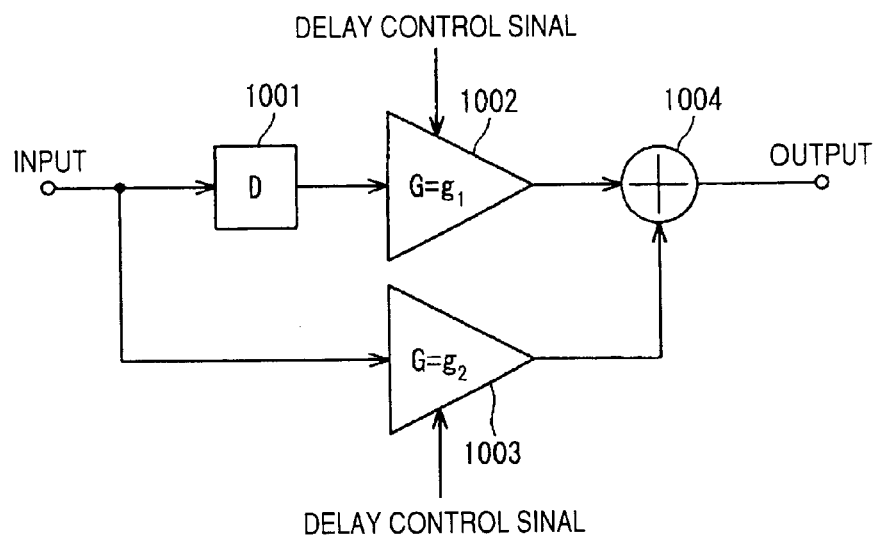
FIG. 11 is a block diagram showing the second example of a variable delay circuit in the timing adjusting circuit of this embodiment.

FIG. 11 shows the second example of the variable delay circuit. This variable delay circuit of the second example is an example constructed of digital filters and includes multipliers 1002, 1003 controlled by a delay control signal of a control signal, a delay device 1001 for delaying the input of one multiplier 1002, and an adder 1004 for adding the outputs of the multipliers 1002 and 1003. In this configuration, by controlling factors g1, g2 of the multipliers 1002, 1003 by the delay control signal, the delay time can be controlled in such a way as to change according to g1/(g1+g2). Here, the digital filters are not limited only to the digital filters of this construction but the variable delay circuit can be also constructed of other digital filters having a more number of taps.

Figure 12:
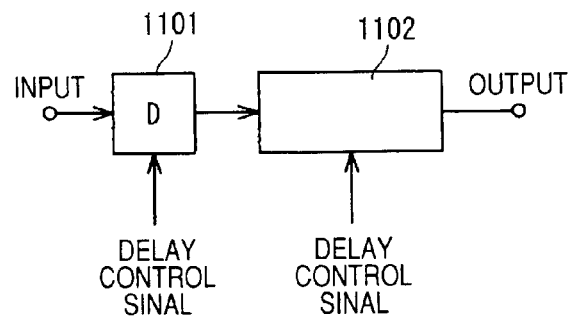
FIG. 12 is a block diagram showing the third example of a variable delay circuit in the timing adjusting circuit of this embodiment.
Figure 13:
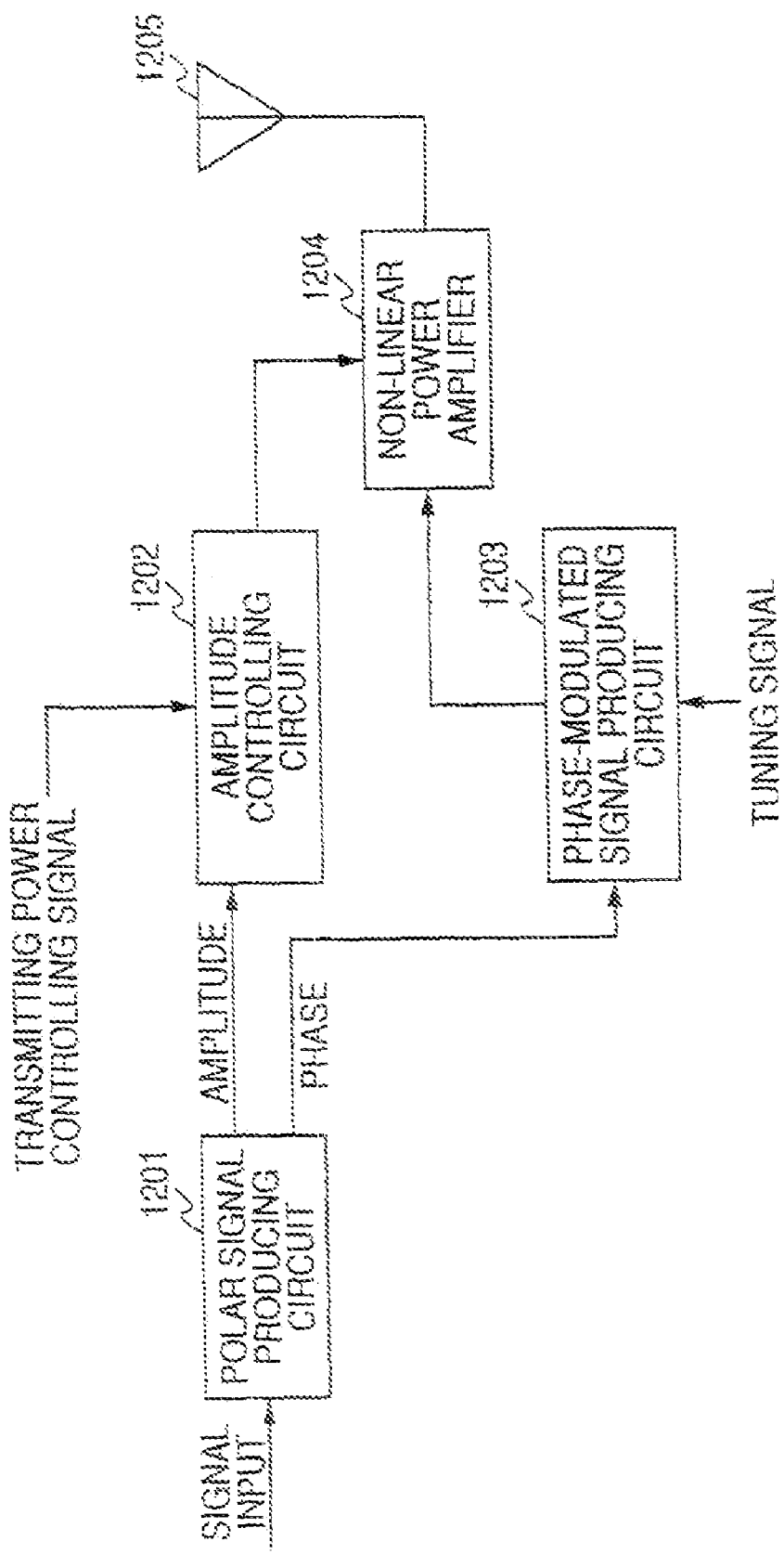
FIG. 13 is a block diagram showing the first conventional example of a polar modulation transmitting apparatus.
Figure 14:
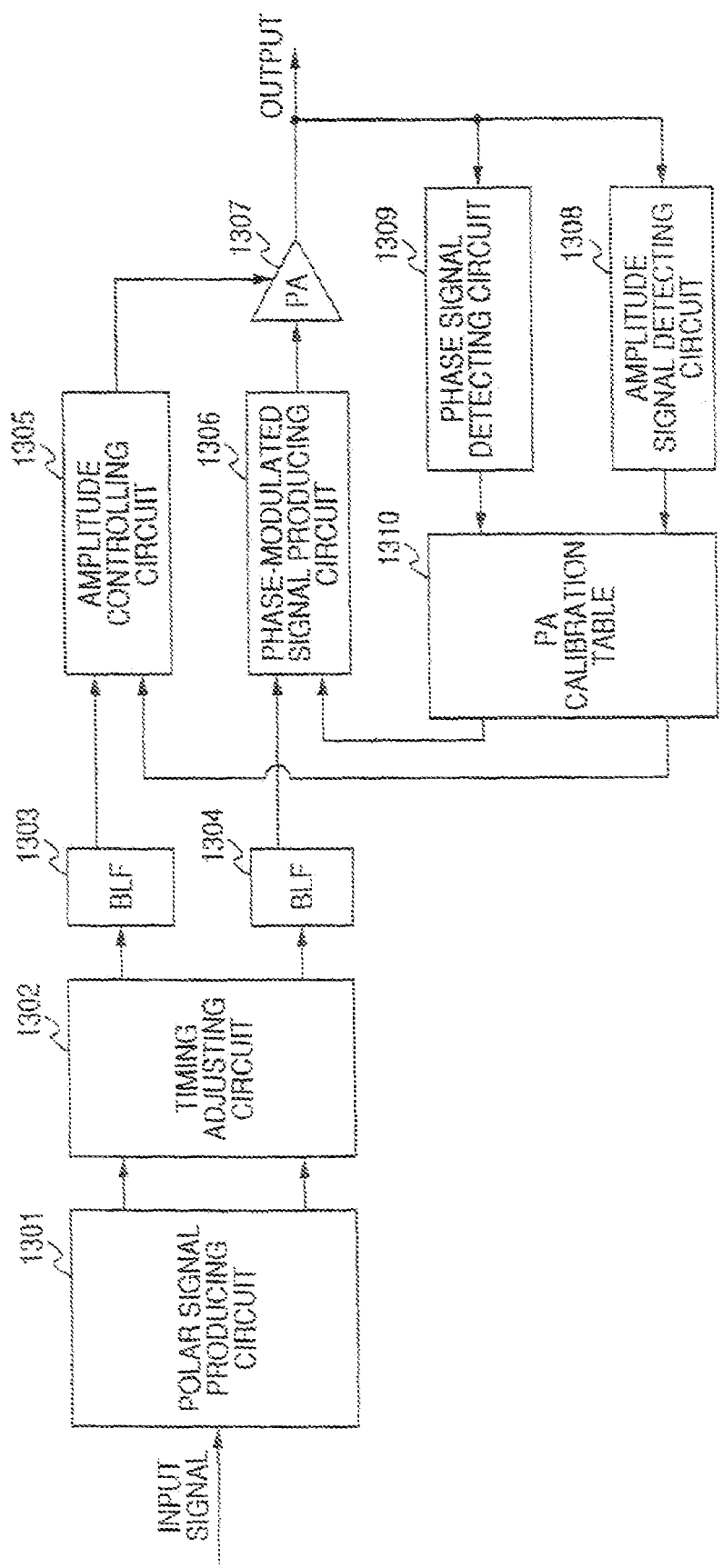
FIG. 14 is a block diagram showing the second conventional example of a polar modulation transmitting apparatus.
Figure 15:
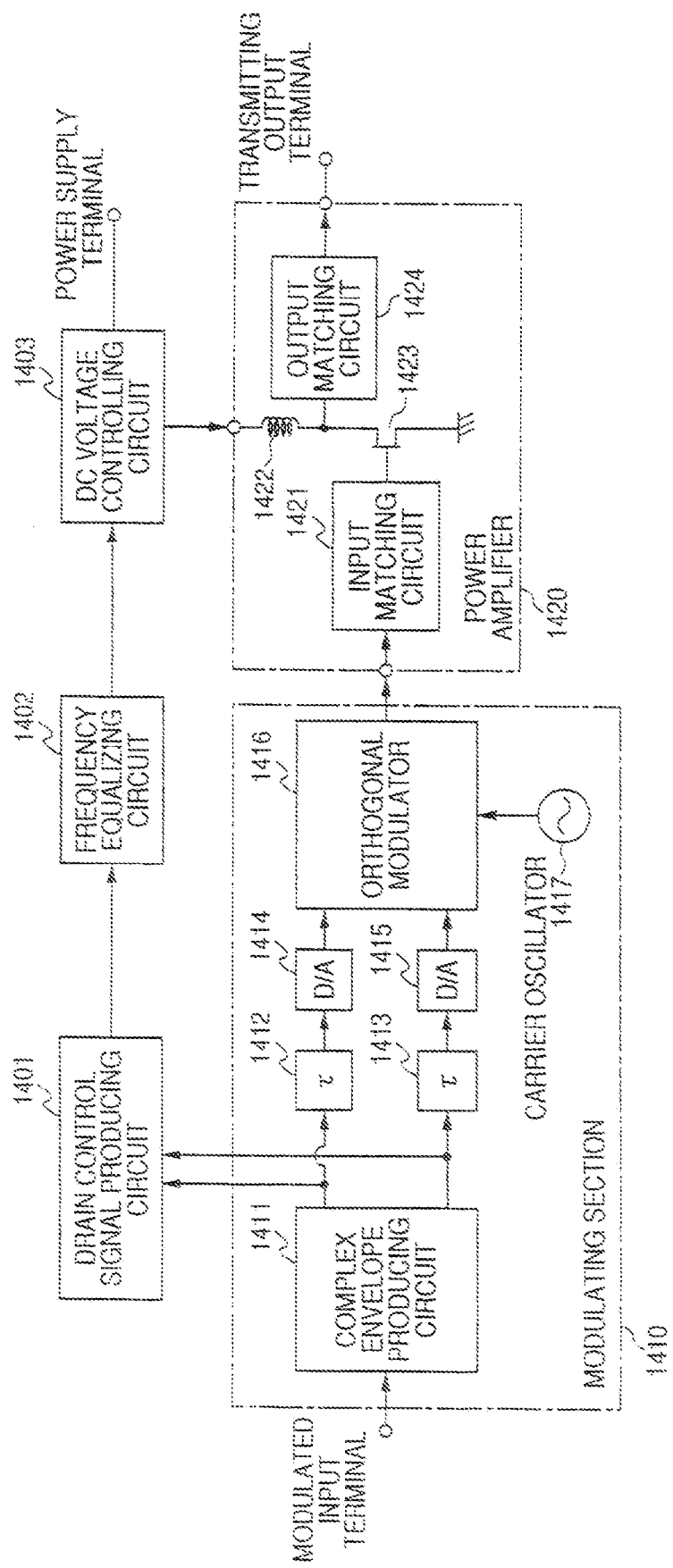
FIG. 15 is block diagram showing the third conventional example of a polar modulation transmitting apparatus.
Figure 16:
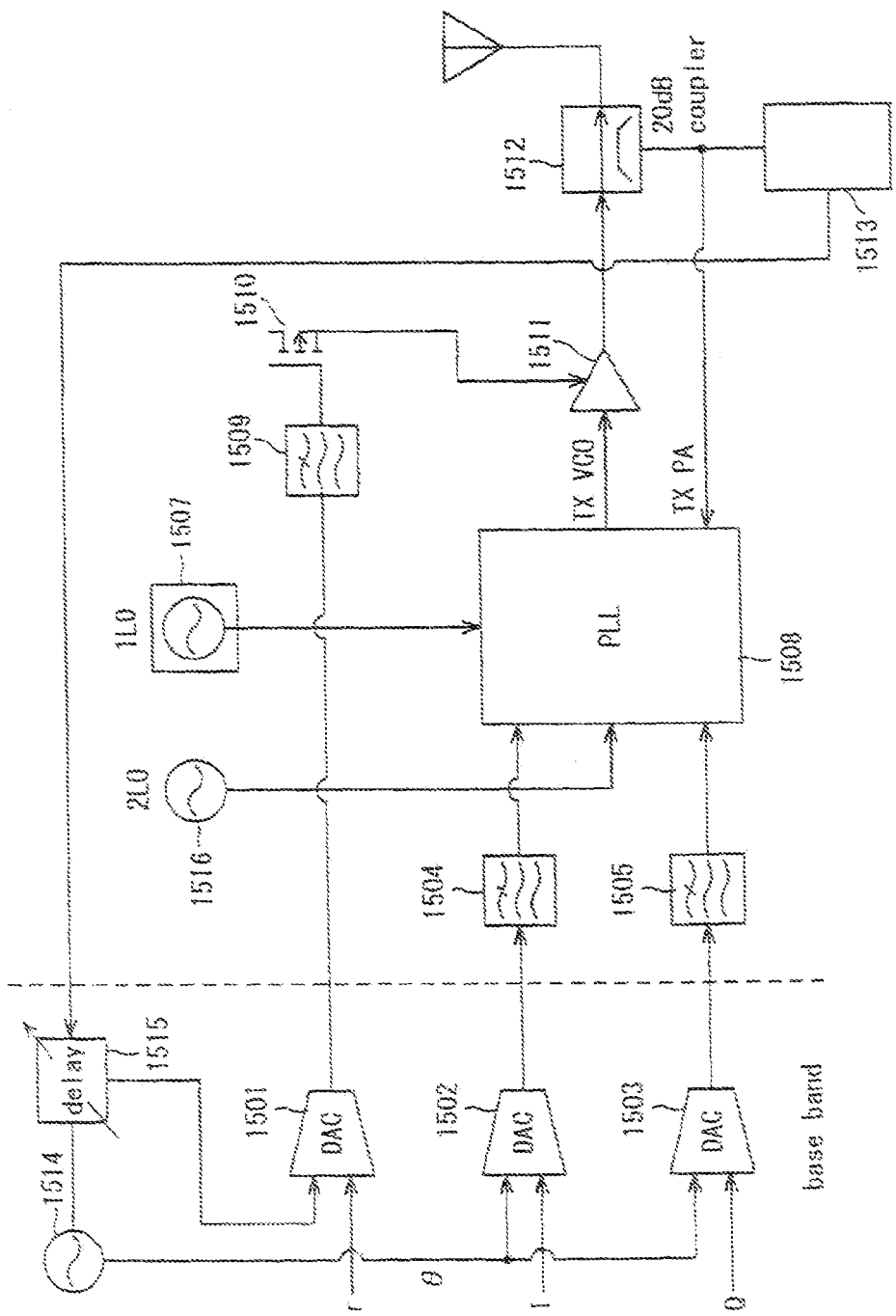
FIG. 16 is block diagram showing the fourth conventional example of a polar modulation transmitting apparatus.

FIG. 12 shows the third example of the variable delay circuit. This the variable delay circuit of the third example includes a delay device 1101 capable of controlling delay time and a digital filter 1102, which are connected in series to each other. In this construction, by controlling the delay times of the delay device 1101 and the digital filter 1102 by the delay control signals of control signals, respectively, it is possible to adjust the delay time by a combination of fine adjustment and rough adjustment and hence to the delay time with high accuracy.

Further, it is possible to vary the clock frequency of the digital circuit by the delay control signal and to control the delay time of the signal by the unit of a clock cycle. The delay time controlling means like this corresponds to rough adjustment. In contrast to this, the construction including the inverters of the first example shown in FIG. 10 and the construction including the inverters of the second example shown in FIG. 11 corresponds to fine adjustment.

As described above, this embodiment includes the timing adjusting circuit 102, the amplitude/phase detecting circuit 109, and the delay difference computing circuit 110 as the synchronization circuit of the amplitude signal and the phase signal of the polar modulation transmitting apparatus. With this construction, the delay difference computing circuit 110 computes the delay difference between the amplitude signal and the phase signal on the basis of the amplitude signal and the phase signal produced by the polar signal producing circuit 101 and the amplitude signal and the phase signal detected by the amplitude/phase detecting circuit 109, and the timing adjusting circuit 102 adjusts the timing on the basis of the obtained delay difference. With this, it is possible to adjust the delay difference between the amplitude signal and the phase signal and to synchronize the amplitude signal and the phase signal automatically.

For example, by applying a control signal for synchronizing the amplitude signal and the phase signal to a polar modulation transmitting apparatus assembled in the adjusting process in the manufacturing line in a plant, it is possible to synchronize the amplitude signal and the phase signal automatically. With this, it is possible to achieve labor savings in the adjusting process.

Further, after the product is shipped, it is also possible to synchronize the amplitude signal and the phase signal automatically at regular intervals. For example, by setting the apparatus to synchronize the amplitude signal and the phase signal automatically every time power is supplied, even if the delay difference between the amplitude signal and the phase signal varies with time, it is possible to prevent the degradation of ACLR and EVM. With this, it is possible to realize a polar modulation transmitting apparatus operating stably.

Still further, by branching the signal inputted to the amplitude/phase detecting circuit 109 just before the multiplying circuit 107 and detecting the amplitude signal and the phase signal at this position, it is possible to make the delay difference in each signal between the detection position and the multiplying circuit 107 smaller than a value required from the characteristics of ACLR and EVM and to detect the amplitude signal and the phase signal from the signals in the base band and hence to eliminate a circuit having a large delay such as low pass filter from the amplitude/phase detecting circuit 109. As a result, it is possible to improve the accuracy of detection of the delay difference and to improve the accuracy of synchronizing adjustment.

While the present invention has been described in detail and with reference to its specific embodiments, it should be apparent to those skilled in the art that other various alternatives and modifications may be made without departing from the spirit and scope of the invention.

The present application is based on Japanese Patent Application No. 2003-288964 filed on Aug. 7, in 2003, the content of which is hereby incorporated by reference into this application.

INDUSTRIAL APPLICABILITY

The present invention produces an effect of providing a transmitting apparatus capable of synchronizing an amplitude signal and a phase signal automatically and can be usefully applied to a transmitting apparatus or the like using polar modulation applied to a radio communication apparatus.

The invention claimed is:

1. A transmitting apparatus using polar modulation, the apparatus comprising:
   a polar signal producer, producing signals corresponding to an amplitude and a phase of a transmitting modulated signal from an input signal;
   an amplitude signal producer, producing an amplitude signal from a signal corresponding to the amplitude;
   a phase-modulated signal producer, producing a phase-modulated signal from a signal corresponding to the phase;
   an amplitude-modulation amplifier, amplitude-modulating the phase-modulated signal by the amplitude signal and the phase-modulated signal to produce a transmitting modulated signal;
   an amplitude/phase detector, detecting an amplitude signal and a phase signal from an input signal to the amplitude-modulation amplifier and an input signal to the phase-modulated signal producer, wherein the amplitude/phase detector is constructed of a digital circuit and has a selector selecting either the amplitude signal or the phase signal and an analog-digital converter converting the selected amplitude signal or phase signal provided at an input section of the amplitude signal and the phase signal;
   a delay difference computer, computing a delay difference between an amplitude signal and a phase signal based on the signal corresponding to the amplitude and the signal corresponding to the phase, which are produced by the polar signal producer, and the amplitude signal and the phase signal, which are detected by the amplitude/phase detector; and
   a timing adjustor, adjusting timings of the amplitude signal and the phase signal based on the delay difference computed by the delay difference computer.

* * * * *